United States Patent

Morcom et al.

[11] Patent Number: 6,162,702
[45] Date of Patent: Dec. 19, 2000

[54] SELF-SUPPORTED ULTRA THIN SILICON WAFER PROCESS

[75] Inventors: William R. Morcom, Indialantic, Fla.; Stephen C. Ahrens, Haddonfield, N.J.; Jeffrey P. Spindler, Rochester, N.Y.; Raymond T. Ford; Jeffrey E. Lauffer, both of Mountaintop, Pa.

[73] Assignee: Intersil Corporation, Palm Bay, Fla.

[21] Appl. No.: 09/334,835

[22] Filed: Jun. 17, 1999

[51] Int. Cl.[7] .................................................. H01L 21/46
[52] U.S. Cl. .......................... 438/459; 438/774; 257/619; 257/678
[58] Field of Search .................................... 438/459, 774, 438/777; 148/33, 33.1, 33.2; 257/619, 678

[56] References Cited

U.S. PATENT DOCUMENTS

| | | | |
|---|---|---|---|
| 5,096,854 | 3/1992 | Saito et al. ............................... | 438/459 |
| 5,213,657 | 5/1993 | Abe et al. ................................ | 438/459 |
| 5,840,614 | 11/1998 | Sim et al. ................................ | 438/464 |
| 5,891,298 | 4/1999 | Kuroda et al. ........................... | 438/459 |
| 5,968,849 | 10/1999 | Bello et al. .............................. | 438/974 |
| 5,981,391 | 11/1999 | Yamada .................................. | 438/974 |
| 6,017,822 | 1/2000 | Mountain ................................ | 438/692 |
| 6,020,252 | 1/2000 | Aspar et al. ............................. | 438/459 |
| 6,033,995 | 3/2000 | Muller .................................... | 438/749 |
| 6,046,117 | 4/2000 | Bauer et al. ............................. | 438/974 |
| 6,100,166 | 8/2000 | Sakaguchi et al. ...................... | 438/459 |

*Primary Examiner*—Charles Bowers
*Assistant Examiner*—David S. Blum
*Attorney, Agent, or Firm*—Jaeckle Fleischmann & Mugel

[57] ABSTRACT

A silicon wafer 2 has an ultra thin central portion 2 that is supported by a circumferential rim 3 of thicker silicon. The central region is thinned by conventional means using conventional removal apparatus. As an alternative method, the central portion is removed using a photoresist mask or a combination of a photoresist mask and a hard mask.

13 Claims, 3 Drawing Sheets

SELF-SUPPORTED ULTRA THIN SILICON WAFER PROCESS

FIELD OF INVENTION

This invention relates generally to the fabrication of vertical power devices and other integrated circuits using ultra thin silicon wafers. The invention relates specifically to the improvement of strength and durability of ultra thin silicon wafers.

BACKGROUND

Protection of the integrity of ultra thin silicon wafers with methods similar to those in the proposed invention has not been documented. Until now ultra thin wafers were formed on handle wafers. In a typical prior art operation, a device wafer is bonded to a handle wafer with a suitable bonding layer, such as silicon dioxide. See, for an example, U.S. Pat. No. 5,728,624. The bonded wafer operation requires numerous steps that could be eliminated if there was a practical method or apparatus for handling ultra thin wafers.

In comparison to thicker silicon wafers, ultra thin silicon wafers have better thermal and electrical-resistance properties in vertical power devices. Without the benefits of this invention, ultra thin silicon wafers are ordinarily subject to bowing and warping, and are vulnerable to breakage or fracture during process handling. The invention uses the inherent strength of the silicon itself, and the methods normally used to etch it, to supply a simple and effective reinforcement that enhances the physical integrity of the ultra thin region of the wafer.

SUMMARY

This invention reveals a process whereby a silicon wafer may be thinned to a specified dimension while retaining a thicker dimension at the wafer's periphery. The periphery is an edge exclusion zone of a specified width which remains at original wafer thickness, or to a specified ground thickness sufficient to provide mechanical support during and after the thinning of the remainder of the wafer. The thicker outer rim of silicon on the periphery acts as a support frame against the forces of stress as the remainder of the wafer is back thinned to a specified dimension. This support frame is integral with and part of the wafer itself. As such, it minimizes bowing and warping that arise from stresses during thinning, and continues to provide strength to the wafer through subsequent process handling. This concept may be applied to wafers of any diameter or type.

DETAILED DESCRIPTION OF INVENTION

Figure 1A:
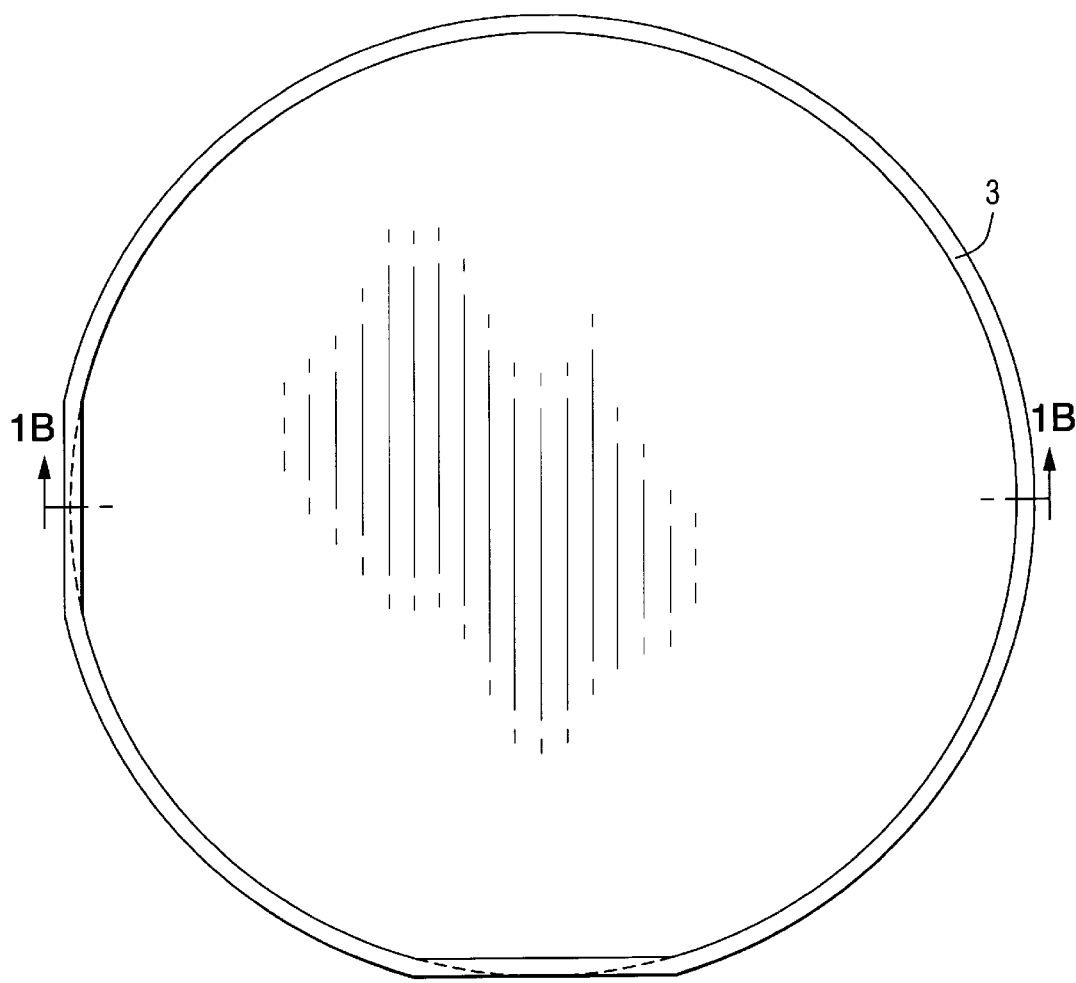
FIG. 1A shows the view of the back side of an ultra thin silicon wafer finished according to the invention, indicating with the space between the concentric circumferences the thicker outer rim of the wafer.
Figure 1B:
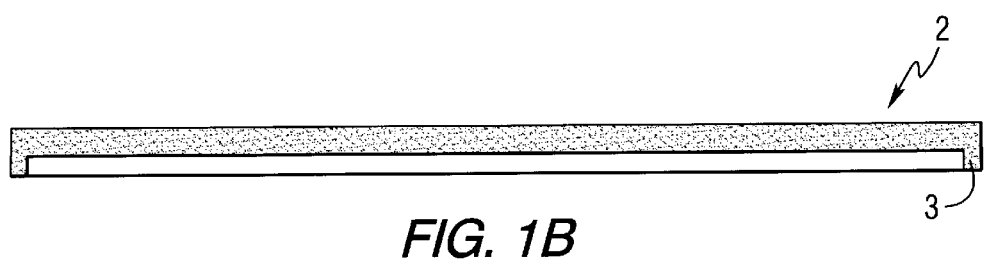
FIG. 1B shows a cross-sectional view of the same ultra thin silicon wafer as in FIG. 1A, with the thicker portion of the wafer shown at its periphery.
Figure 2:
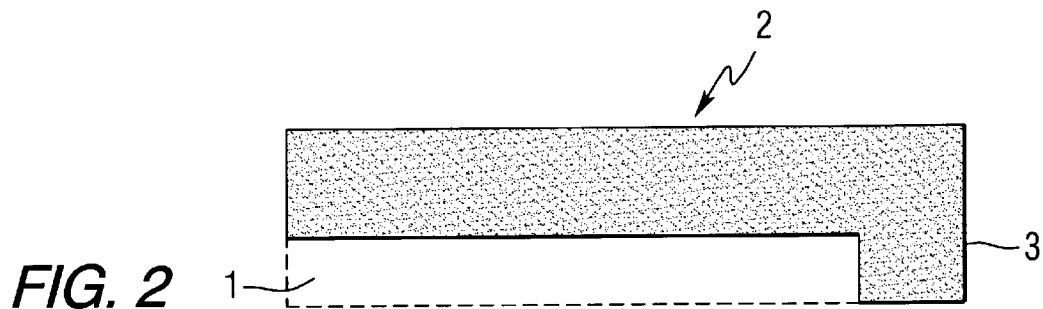
FIG. 2 shows a cross-section of one edge of the same wafer as in the previous figures, showing the thicker outer rim of the wafer, and the homogeneous content of both the ultra thin and the thick portions of the wafer.

Several methods of achieving the end result shown in FIGS. 1A and 1B are available. Refer to FIG. 2. In a first method, a volume of silicon 1 is removed from a silicon wafer 2 by a controlled mechanical or physical means such as grinding, milling, drilling or laser, so that a desired width of silicon 3 is not removed. All of those removal techniques are conventional.

Figure 3A:
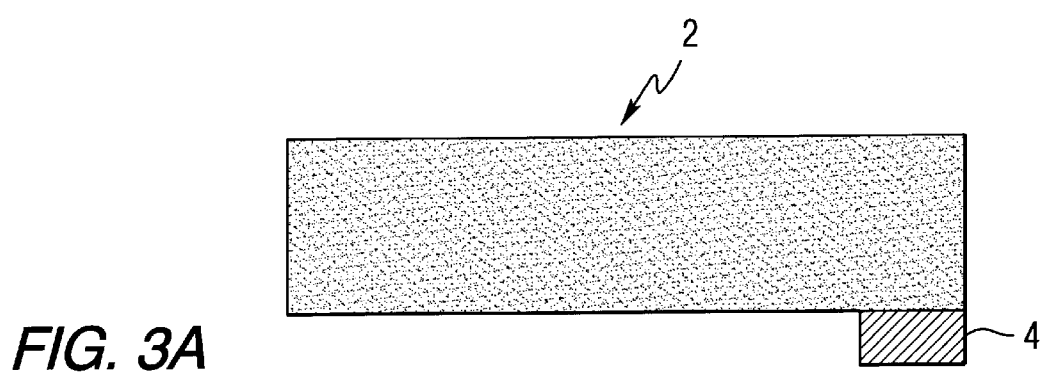
FIG. 3A shows a cross-section of one edge of an unfinished wafer, indicating the presence of an applied mask over the area to be left thick during an etching process.

Refer to FIG. 3A. In a second method a dry processing technique such as plasma etch of silicon or a wet etch, a mask 4 is formed on the rim of the wafer. The mask 4 covers the outer rim of silicon and prevents it from being removed from wafer 2 during an etching process. Any suitable conventional silicon etching process may be used including and no limited to dry plasma etch and wet chemical etch of silicon. Mask 4 is any suitable material that resists removal of the etchant. Such materials include and are not limited to photoresist or other attached films that will withstand the silicon etching process.

Figure 3B:
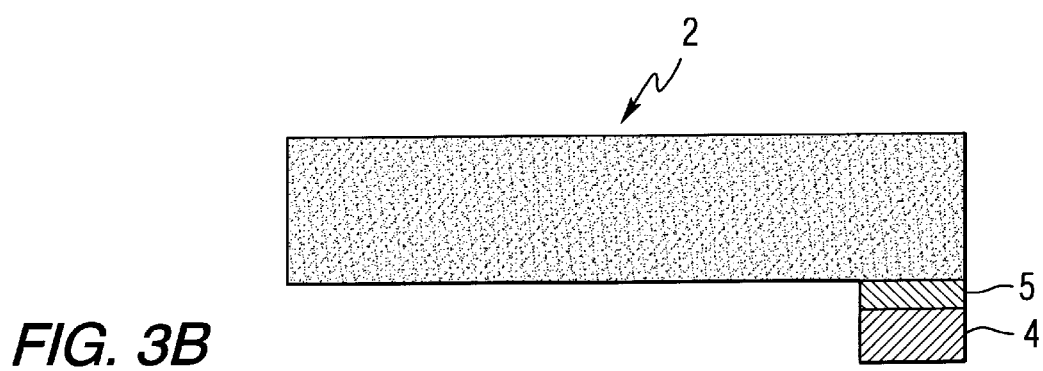
FIG. 3B shows a cross-section of one edge of an unfinished wafer, indicating the presence of both a hard mask and an applied mask over the area to be left thick through the subsequent photoresist and etch processes.

A third method is shown in FIG. 3B. In the third method, a deposited or thermally-grown hard mask 5 is formed on the outer rim. The hard mask 5 may be a deposited or thermally-grown oxide, BPSG or silicon nitride. The hard mask 5 initially covers the entire surface of the wafer 2. Next photoresist is applied and patterned to develop a photoresist mask covering the outer rim of the underlying hard mask 5. The central portion of the photoresist is removed by conventional etching to leave the hard mask 5 covering the outer rim. Then a conventional silicon etching operation is performed to remove enough silicon to form a wafer with an ultra thin center portion and a thicker annular portion.

Figure 3C:
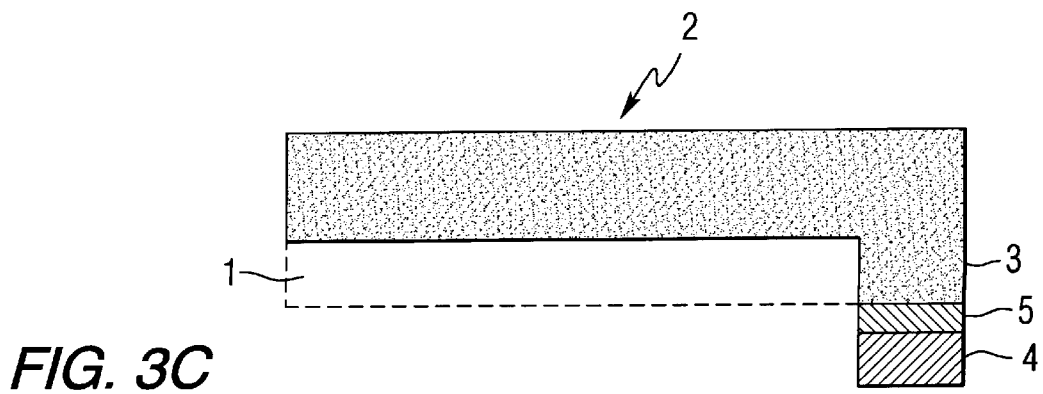
FIG. 3C shows a cross-section of one edge of a silicon wafer shaped according to the invention but before removal of residual applied mask and hard mask material, indicating the same profile of silicon as in FIG. 2.

In both the second method and the third method, the mask serves to protect the outer edge of the wafer from being removed during a silicon etching process, resulting in the final profile seen in FIG. 3C. The masking materials may or may not be removed, depending on whether or not they can withstand subsequent processing steps.

Alternate Embodiments of the Invention

Figure 4:
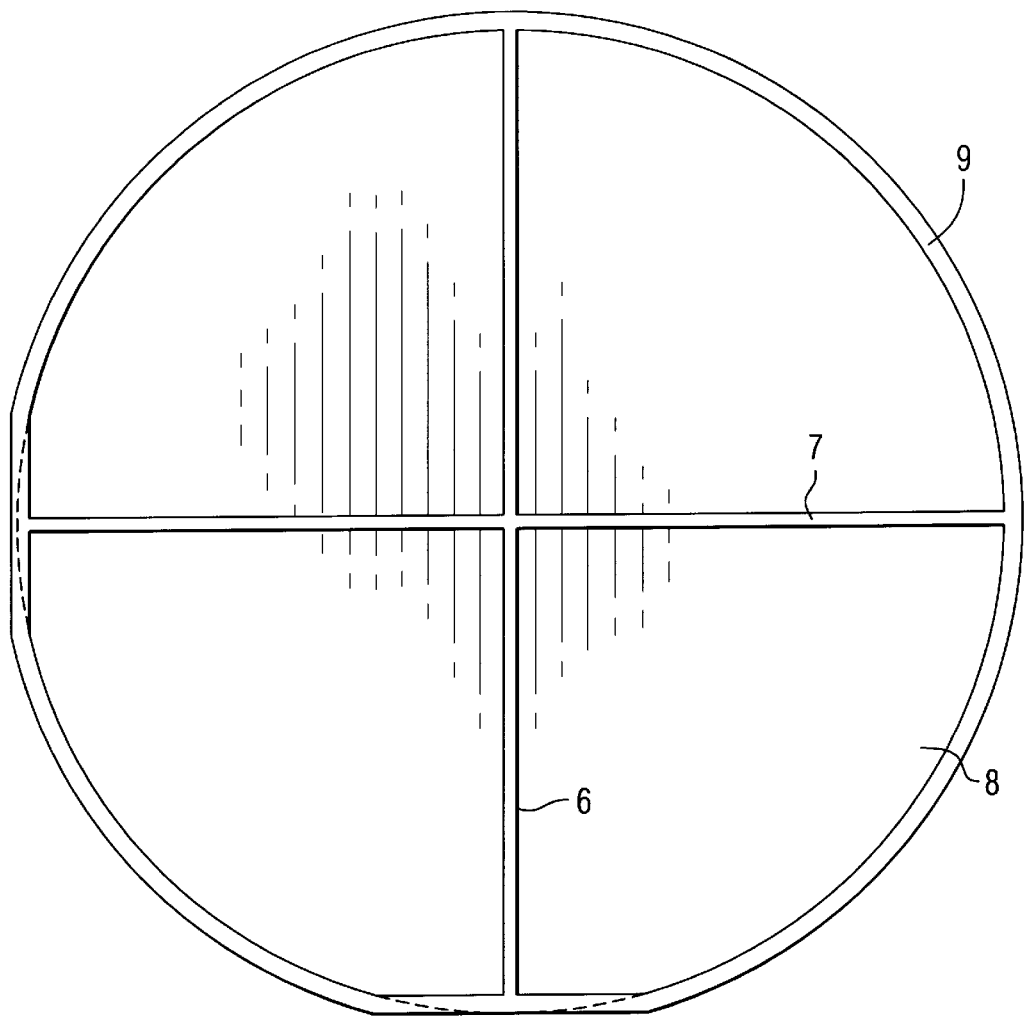
FIG. 4 shows the view of the back side of an ultra thin silicon wafer finished according to a different embodiment of the invention.
Figure 5:
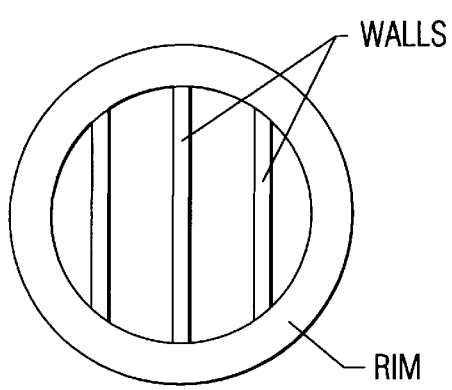
FIGS. 5 and 6 shows alternate embodiments of the invention with parallel supporting backside walls and intersecting walls, respectively.
Figure 6:
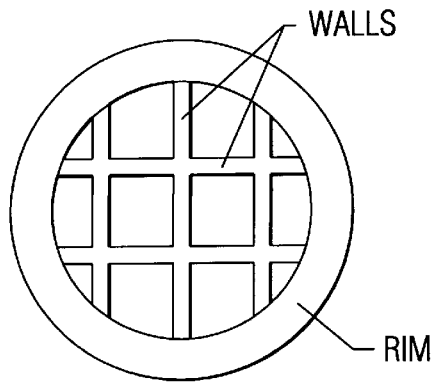

See FIG. 4. In an alternate embodiment of the invention, the use of reinforcement by retained thickness of wafer silicon is extended to include ribs 6 and 7 spanning wafer 8 and abutting rim 9. Ribs 6 and 7 are most easily defined and retained using either the second or the third method of silicon removal described above. While FIG. 4 shows a simple cross pattern with a vertical rib 6 and a horizontal rib 7, the masking and etching processes are flexible and permit the use of any convenient pattern of ribbing such as honeycomb or rectilinear grid. See FIG. 6. As an alternative, the wafer could be patterned to have a plurality of chords that extend across the wafer an intersect the rim of thicker silicon. See FIG. 5. The cord structures may be used with or without the ring. The rectilinear grid may be formed underneath the regions that space the devices or integrated circuits from each other. Such areas are normally removed during assembly operations when the space between the devices or circuits is cut with a dicing saw or laser. The advantage of such embodiments is the enhanced strength they afford the ultra thin silicon wafer, thereby facilitating the use of larger wafers than would otherwise be possible.

In the preferred embodiment the ultra thin regions of the wafer have a thickness in the range of 1 to 250 microns. A typical substrate for power applications is 75 microns thick but recent reports indicate that some manufacturers use power substrates as thin as 50 microns. The supporting ring and ribs have a thickness that corresponds to the original thickness of the wafer, i.e., 500 to 800 microns thick. The ultra thin regions are characterized by a thickness that is so thin that it cannot hold a substantially planar shape without support. The thick rib or rim is approximately 2 to 800 times the thickness of the ultra thin regions that the rim and rib supports.

The description, summary and range of alternative embodiments described above, together with the figures, portray the invention's benefits in strengthening ultra thin silicon wafers against breakage and fracture. The invention supplies these benefits without adding complications inherent in the incorporation of added separate reinforcement materials and special wafer-handling restrictions. Moreover, while the above description is made in reference to silicon wafer, those skilled in the art understand that any other semiconductor material may be used, including and not limited to germanium, gallium arsenide, and heterogeneous and homogeneous combinations of semiconductor material.

Given the advantages of the use of ultra thin silicon wafers in fabrication of vertical power devices, i.e., the improvement of the wafers' thermal and electrical-resistance properties, the invention reduces the rate of loss of such wafers due to breakage or fracture, and facilitates the use of larger wafers than would be possible without the invention's reinforcement effects.

Although the description, embodiments and illustrative material above contain many details, these details should not be construed as limiting the scope of the invention but as merely providing illustrations and examples of some of the preferred embodiments of the invention. Thus the scope of the invention should be determined by the appended claims and their legal equivalents, rather than by the examples given above.

What we claim is:

1. A method for forming an ultra thin wafer comprising the steps of: providing a semiconductor wafer;

depositing a mask on one surface of the wafer, patterning the mask to define a support area;

removing selected portions of the wafer from one surface thereof to provide one or more ultra thin regions; and leaving further selected portions on the surface of the wafer to support the ultra thin regions.

2. The method of claim 1 wherein the ratio of thickness of the ultra thin region to the support structure is in a range from 1:2 to 1:800.

3. The method of claim 1 wherein the the thickness of the ultra thin region is from 1 to 250 microns and the thickness of the support regions is from 500 to 800 microns.

4. The method of claim 1 wherein the step of depositing a mask comprises depositing a photoresist mask.

5. The method of claim 2 comprising wherein the photoresist mask defines a ring circumscribing the outer rim of the surface of the wafer.

6. The method of claim 3 wherein the the photoresist mask further defines a plurality of radial ribs extending from the center of the surface to the ring circumscribing the outer rim of the surface of the wafer.

7. The method of claim 1 wherein the step of depositing a mask comprises depositing a hard mask material on the surface of the wafer and depositing a photoresist mask on the hard mask material.

8. The method of claim 5 further comprising the steps of patterning the photoresist mask and the hard mask to define a ring circumscribing the outer rim of the surface of the wafer.

9. The method of claim 6 wherein the hard mask and the photoresist mask are further patterned to define a plurality of radial ribs extending from the center of the surface to the ring circumscribing the outer rim of the surface of the wafer.

10. The method of claim 2 wherein the photoresist mask is patterned to define a plurality of supporting chords that extend across the wafer and are spaced approximately the width of a device or integrated circuit.

11. The method of claim 8 further comprising defining the photoresist to form a second set of wall transverse to the first set and spaced approximately the length of a device or integrated circuit.

12. The method of claim 2 comprising the further step of depositing a hard mask material on the surface of the wafer and depositing a photoresist mask on the hard mask material, patterning the photoresist mask to define plurality of supporting chords that extend across the wafer and are spaced approximately the width of a device or integrated circuit and removing the hard mask from areas not covered by the patterned photoresist and removing the semiconductor material from areas not covered by the hard mask.

13. The method of claim 8 further comprising defining the photoresist to form a second set of wall transverse to the first set and spaced approximately the length of a device or integrated circuit, removing the exposed hard mask and then removing the exposed semiconductor material.

* * * * *